United States Patent
Sandhu et al.

(10) Patent No.: US 9,473,114 B1
(45) Date of Patent: Oct. 18, 2016

(54) POWER-ON-RESET DETECTOR

(71) Applicant: ARM Limited, Cambridge (GB)

(72) Inventors: Bal S. Sandhu, San Jose, CA (US); James Myers, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/687,526

(22) Filed: Apr. 15, 2015

(51) Int. Cl.
*H03L 7/00* (2006.01)
*H03K 3/013* (2006.01)
*H03K 17/22* (2006.01)
*H03K 3/3565* (2006.01)

(52) U.S. Cl.
CPC ............ *H03K 3/013* (2013.01); *H03K 3/3565* (2013.01); *H03K 17/223* (2013.01)

(58) Field of Classification Search
USPC .................. 327/142, 143, 198, 205, 206
See application file for complete search history.

(56) References Cited

U.S. PATENT DOCUMENTS

| | | | |
|---|---|---|---|
| 5,612,641 A * | 3/1997 | Sali | 327/143 |
| 6,731,143 B2 * | 5/2004 | Kim | 327/143 |
| 6,870,413 B1 * | 3/2005 | Chang et al. | 327/205 |
| 8,451,261 B2 * | 5/2013 | Yoon | 345/212 |
| 2005/0104635 A1 * | 5/2005 | Sekino et al. | 327/143 |
| 2007/0170961 A1 * | 7/2007 | Liao et al. | 327/143 |
| 2010/0013529 A1 * | 1/2010 | Kawakita | 327/143 |

* cited by examiner

*Primary Examiner* — Brandon S Cole
(74) *Attorney, Agent, or Firm* — Pramudji Law Group PLLC; Ari Pramudji

(57) ABSTRACT

Various implementations described herein are directed to an integrated circuit for power-on-reset detection. The integrated circuit may include a first stage configured to receive an input voltage signal and provide a triggering signal during ramp of the input voltage signal. The integrated circuit may include a second stage configured to receive the triggering signal from the first stage and provide an output voltage signal during ramp of the input voltage signal via gate leakage through at least one transistor.

20 Claims, 4 Drawing Sheets

POWER-ON-RESET DETECTOR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits include circuitry to perform monitoring functions to assist with detecting whether a power supply has reached safe levels. Sometimes, integrated circuits are subject to current surges, and protection may be achieved with a type of circuit known as a power-on-reset (POR) detector.

FIG. 1 shows an example of a POR circuit. In this circuit, one or more diode drops are taken from a voltage supply VDD to charge an internal node N via a resistor-capacitor (RC) input circuit, where $R_{big}$ and $C_{big}$ are large. The diode D1 is used to ensure that the voltage supply VDD has reached at least 1-diode drop above ground (GND or VSS) before a reset signal is disabled. Unfortunately, with this type of circuit, the reset time constant can change significantly due to a strong dependence of diode voltage on temperature. For instance, compared to room temperature, the reset time can increase by 20× at cold temperature, while decreasing by 5× at hot temperature.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to circuitry for power-on-reset (POR) detection. For instance, in one implementation, such circuitry may refer to a nano-power, low-voltage, POR detector with zero standby current. Such circuitry may relate to an on-chip supply monitoring system that monitors and detects when chip power supply has reached a safe and stabilized level, while maintaining internal circuitry in a reset state to prevent current surges during supply ramp-up. As described herein, this type of POR detection circuitry may be used to keep a chip in a reset state for some time after the supply voltage (VDD) has reached full source. Further, this type of POR detection circuitry may be used to provide a temperature independent resistor-capacitor (RC) time constant using transistor gate-leakage (e.g., metal-oxide-semiconductor field-effect transistor (MOSFET) gate leakage) to provide an accurate time constant to control system reset time. Still further, this type of POR circuit may offer significantly lower power than alternatives and may function down to sub-threshold voltages and ultra-low nano-Amp (nA) standby current and low micro-Amp (uA) current during switching (e.g. ~35 uA).

Various implementations of power-on-reset (POR) detector circuitry described herein will now be described in more detail with reference to FIGS. 2-5.

Figure 1:
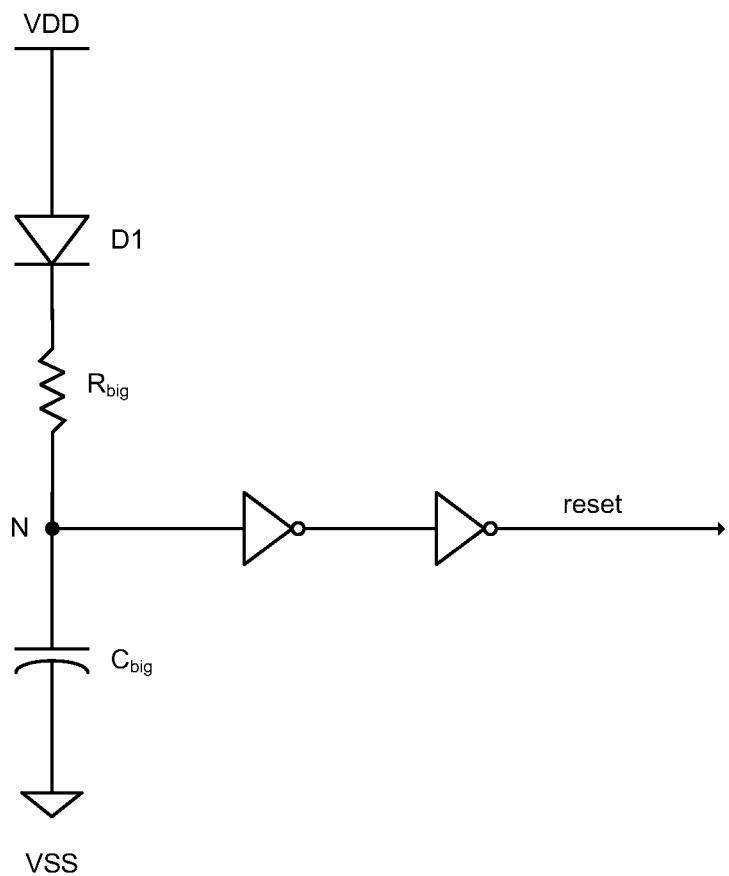
FIG. 1 illustrates a diagram of power-on-reset circuitry as known in the art.
Figure 2:
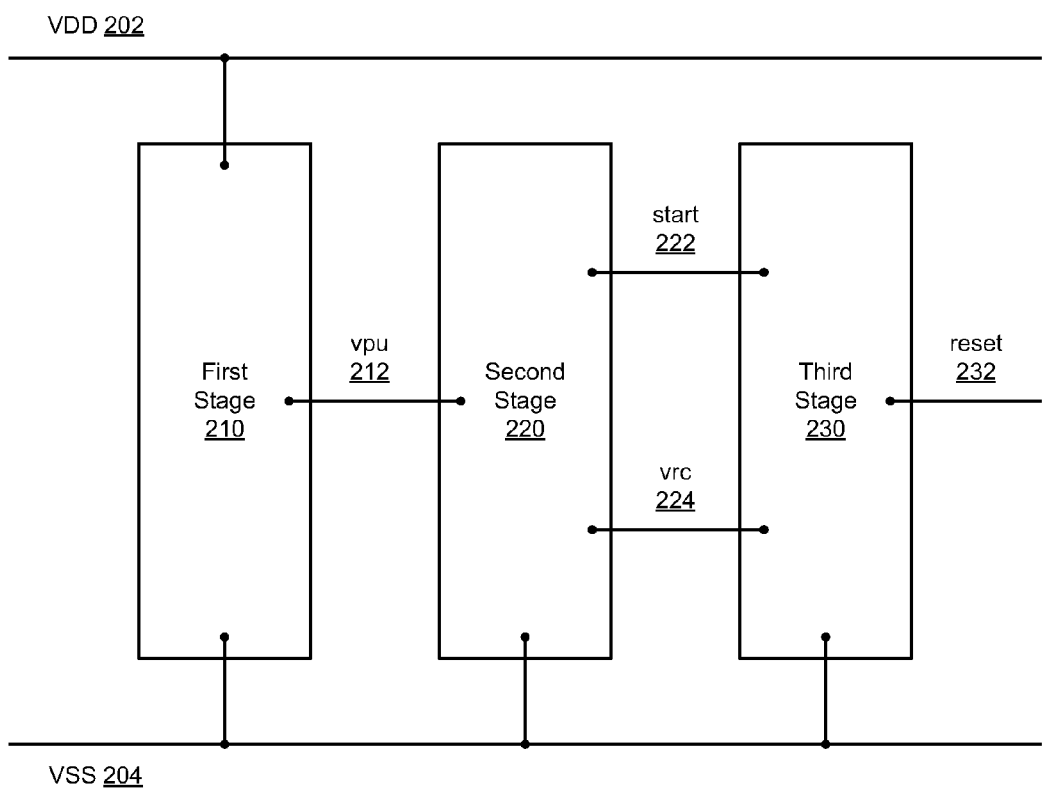
FIG. 2 illustrates a block diagram of power-on-reset (POR) detector circuitry in accordance with various implementations described herein.

FIG. 2 illustrates a block diagram of power-on-reset (POR) detector circuitry 200 in accordance with various implementations described herein. The POR detector circuitry 200 may be implemented with multiple stages and may be referred to as POR circuitry and/or a POR detector circuit.

The circuitry 200 may include a first bus 202 configured to provide a supply voltage VDD, which may be referred to as an input voltage or input signal. In this manner, the first bus 202 may be referred to as a first voltage source for supplying power (i.e., supply voltage VDD) to the POR detector circuit. The circuitry 200 may include a second bus 204 configured to provide another supply voltage GND or VSS (e.g., ground voltage or ground supply voltage). The second bus 204 may be referred to as a second voltage source for providing the supply voltage GND or VSS to the POR detector circuit.

The POR detector circuitry 200 may include a first stage 210, a second stage 220, and a third stage 230. The first stage 210 may include a triggering stage interposed between the first bus 202 for coupling to the supply voltage VDD and the second bus 204 for coupling to the supply voltage VSS. The first stage 210 may be configured to provide a triggering voltage (vpu) 212 to the second stage 220. As described in greater detail herein, the first stage 210 may provide noise protection from fluctuations in the input supply voltage VDD, generate the triggering voltage (vpu) 212 during VDD ramp, and enable the POR detector to start monitoring the VDD source.

The second stage 220 may include a ramp delaying stage configured to receive the triggering signal (vpu) 212 from the first stage 210 and provide an output voltage (vrc) 224 during ramp (or ramp-up) of the input voltage 202. Further, the second stage 220 may be configured to provide a start signal 222 internally to the third stage 230. As described in greater detail herein, the output voltage (vrc) 224 is provided during ramp of the input voltage VDD using a gate-leakage based RC time constant to set a reset time to be independent of temperature in a small area circuit configuration.

The third stage 230 may include a buffering stage configured to receive and buffer the output voltage (vrc) 224 during ramp of the input voltage 202 and further provide the reset signal 232 in an output path thereof. The third stage 230 may be configured to provide hysteresis and noise protection for the reset signal 232 in the output path. Further, the third stage 230 may be configured to restrain rush-through current associated with the output voltage (vrc) 224 received from the second stage 220.

In various implementations, the input supply voltage VDD may be configured to provide a first power supply voltage within a range of approximately 0V to 3.3V. As described herein, each stage may be configured to utilize one or more circuit components that may be configured for operating together to perform power-on-reset (POR) detection.

Figure 3:
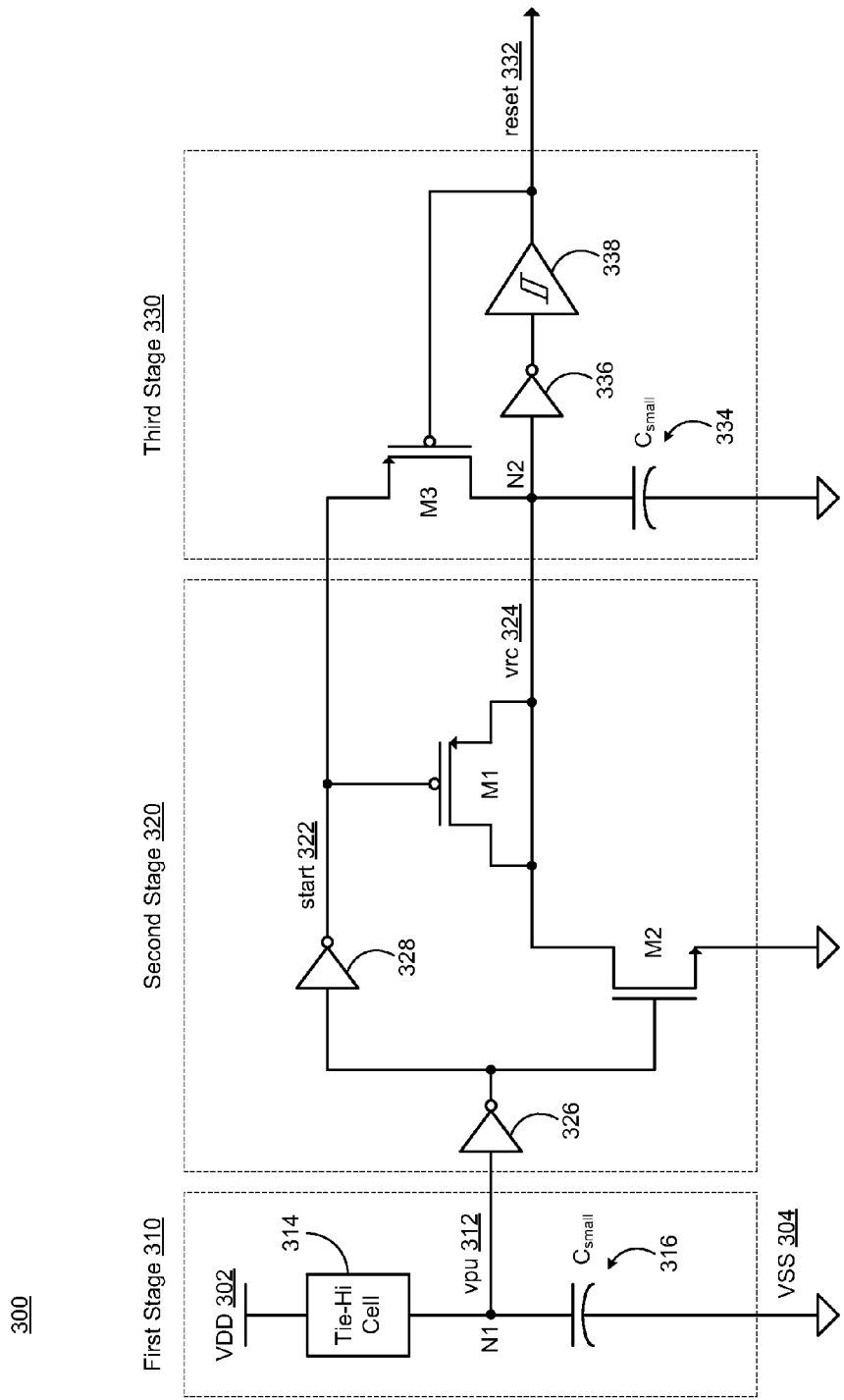
FIG. 3 illustrates a schematic diagram of POR detector circuitry in accordance with various implementations described herein.

FIG. 3 illustrates a diagram of POR detector circuitry 300 in accordance with various implementations described herein. As shown in FIG. 3, the POR detector circuit 300 may be implemented as an integrated circuit with multiple stages and may be referred to as POR circuitry and/or a POR detector circuit.

The circuit 300 may include a first bus 302 configured to provide a first voltage supply signal, such as an input supply voltage VDD or signal. The circuit 300 may include a second bus 304 configured to provide a second voltage supply signal, such as a supply voltage VSS or signal.

The POR detector circuit 300 may include an integrated circuit with multiple stages including a first stage 310, a second stage 320, and a third stage 330. The stages 310, 320, 330 are arranged to use a gate-leakage based RC time constant to set a reset time to be independent of temperature in a small area circuit configuration. In one implementation, a POR trip-time RC time constant may be based on thin-oxide gate leakage, which may be independent of temperature. For instance, the POR reset trip time may be ~14 mS from VDD power ramp and may have a variation of 0.4 mS over temperature from 0° C. to 100° C. Further, in some instances, the circuit 300 may filter incoming VDD to generate a clean start signal 322, and the circuit 300 may further filter a reset output signal 332 with a Schmitt-trigger buffer providing hysteresis, as further described herein below.

The first stage 310 may include a resistor 314 and a first capacitor 316 arranged to receive the input voltage signal VDD and provide a triggering signal (vpu) 312 during ramp of the input voltage signal VDD. The resistor 314 may include a tie-hi cell having multiple transistors, wherein the tie-hi cell and the capacitor 314 may be arranged to filter the input voltage signal VDD and reduce noise associated with the input voltage signal VDD. The tie-hi cell is described in more detail below with reference to FIG. 4. Further, the first capacitor 316 may be a small capacitor having low capacitance.

The second stage 320 may include a first transistor M1 and a second transistor M2 arranged to receive the triggering signal (vpu) 312 from the first stage 310 and provide an output voltage signal (vrc) 324 during ramp of the input voltage signal VDD via gate leakage through the first transistor M1. The second stage 320 may be configured to provide the output voltage signal (vrc) 324 by delaying the ramp of the input voltage signal VDD using the gate leakage through the first transistor M1.

In some implementations, the first transistor M1 may be a p-type metal-oxide-semiconductor (PMOS) field-effect transistor (FET) intercoupled to function as a capacitor having high gate input resistance, in the high giga-ohms. The second transistor M2 may be an n-type MOS (NMOS) FET. The first transistor M1 and the second transistor M2 may be arranged to each receive the triggering signal (vpu) 312 from the first stage 310 and further arranged to provide the output voltage signal (vrc) 324 during ramp of the input voltage signal VDD via gate leakage through the first transistor M1.

The second stage 320 may include one or more inverters, such as, e.g., a first inverter 326 and a second inverter 328. The first inverter 326 may be configured to buffer the triggering signal (vpu) 312 received from the first stage 310 and provide an inverted triggering signal (nvpu) to the second inverter 328 to provide the start signal 322 to drive a gate of the first transistor M1. Further, the first inverter 326 may be configured to buffer the triggering signal (vpu) 312 received from the first stage 310 and provide an inverted triggering signal (nvpu) to drive a gate or the second transistor M2.

The third stage 330 may include a second capacitor 334, a third transistor M3, a third inverter 336, and a Schmitt trigger 338 arranged to receive the output voltage signal (vrc) 324 from the first stage 310 and provide a reset signal 332 during ramp of the input voltage signal VDD via gate leakage through the first transistor M1. The second capacitor 334 may be a small capacitor with low capacitance.

The third inverter 336 may be positioned in a path of the output voltage signal (vrc) 324, and the third transistor M3 may be configured to restrain a rush-through current in the third inverter 336. In some implementations, the third transistor M3 may include a PMOS transistor or FET. Further, the Schmitt trigger 334 may be positioned in a path of the output voltage signal (vrc) 324 to provide hysteresis to the reset signal 332 and reduce noise associated with the output voltage signal (vrc) 324.

The output voltage signal (vrc) 324 may correspond to the reset signal 332, which may be referred to as a reset timing signal. The gate leakage through the first transistor M1 may correspond to a resistor-capacitor (RC) time constant configured to control the reset timing signal 332. Further, in some instances, the gate leakage through the first transistor M1 may correspond to a temperature independent RC time constant that uses the gate leakage through the first transistor M1 to provide a predetermined time constant to control the reset timing signal 332. As such, the output voltage signal (vrc) 324 may correspond to the reset timing signal 332, wherein the first and second stages 310, 320 may be arranged to delay the reset timing signal 332 for a period of time after the input voltage signal VDD has reached a full source voltage.

In various implementations, the POR detection circuit 300 of FIG. 3 comprises a nano-power, low-voltage, POR detector with zero standby current and may operate as follows. In this circuit 300, the VDD supply may charge an internal node N1 through the tie-hi cell 314 and the small capacitor 316, e.g., without any voltage drop. As VDD ramps high, the internal signal (vpu) 312 may force the start signal 322 to ramp high thereby driving the gate of the first transistor M1 to VDD and the gate of the second transistor M2 to GND or VSS. In some instances, the first transistor M1 may be a PMOS coupled capacitor which may have significantly high or somewhat "infinite" input resistance looking into the gate. The third transistor M3 may provide a high-gain pull-up once the vrc node N2 crosses ~0.5V to quickly pull vrc 324 to full-source thereby restraining or limiting a rush-through current in the third inverter 336 coupled to the vrc node N2. The internal vrc node N2 starts at GND or VSS and may then rise toward VDD by the gate-leakage through the first transistor M1. This gate leakage may be independent of temperature and may be directly proportional to:

$$Ig \propto \frac{Vgs}{\sqrt{tox}},$$

where Ig is the gate-leakage current, Vgs is the voltage across the gate of M1, and tox is the gate-oxide thickness. For example, the gate-leakage at room temperature may be ~20 pA/um of device width for a 65 nm process technology node.

In some implementations, the layout of the POR detection circuit 300 may be on a small scale or size and may occupy a cell area of ~550 sq. um, which be equivalent to an approximate size of two (2) flip-flops. Further, the circuit 300 is relatively small and may not use large resistors or capacitors to generate the RC time constant.

In some implementations, the VDD supply may ramp up from 0V to 1.2V in ~10 mS, and the reset may follow VDD and may stay high after VDD has stabilized for an additional ~4 mS. This reset time constant may be considered independent of temperature and may vary by only ~1 mS over a temperature range of 0° C. to 100° C. Further, for sub-threshold operation, the POR detection circuit 300 may be fully functional and operate down to VDD=0.3V.

In reference to FIG. 3, the input supply voltage VDD may be configured to provide a first power supply voltage within a range of approximately 0V to 3.3V. As described herein, each stage 310, 320, 330 of circuit 300 may be configured to utilize various components that may be configured for operating together to perform POR detection.

Figure 4:
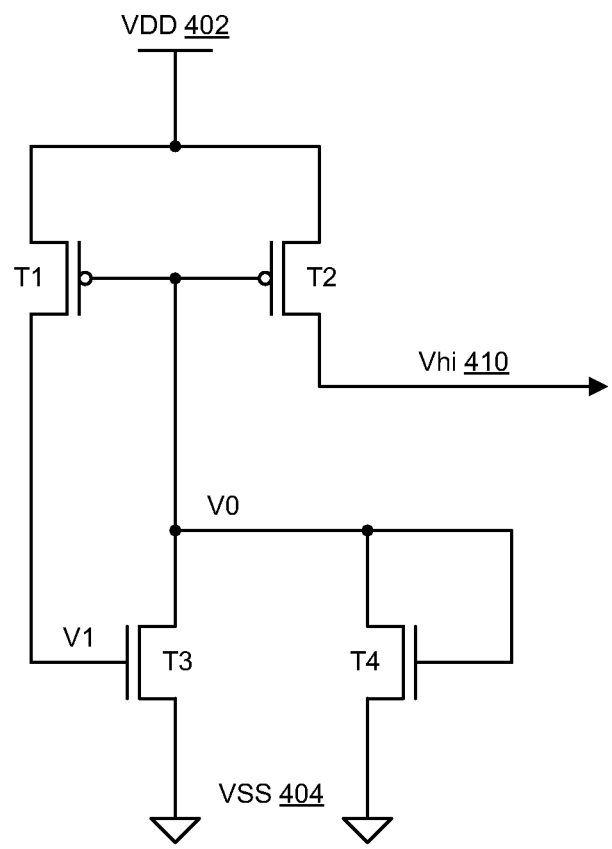
FIG. 4 illustrates a schematic diagram of tie-hi cell circuitry in accordance with various implementations described herein.

FIG. 4 illustrates a diagram of tie-hi cell circuitry 400 in accordance with various implementations described herein. As shown in FIG. 4, the tie-hi cell 400 may be implemented as an integrated circuit with multiple transistors and may be referred to as tie-hi circuitry and/or a tie-hi circuit.

The tie-hi cell circuitry 400 may include a first bus 402 configured to provide a first voltage supply signal, such as an input supply voltage VDD or signal. The circuit 400 may include a second bus 404 configured to provide a second voltage supply signal, such as another supply voltage VSS or signal.

In various implementations, the tie-hi cell circuitry 400 is a resistive coupling that may be configured to protect the POR detection circuit from direct coupling to the input supply voltage VDD. As shown in FIG. 4, the tie-hi cell circuitry 400 may include multiple transistors, including a first transistor T1, a second transistor T2, a third transistor T3, and a fourth transistor T4, arranged to filter the input voltage signal VDD and reduce noise associated with the input voltage signal VDD.

For instance, as VDD ramps-up, the fourth transistor T4 maintains node V0 above Vth (V_threshold), which turns the first and second transistors T1, T2 on after VDD has reached a Vth drop. Further, the tie-hi cell circuitry 400 may be configured to provide a full source output voltage Vhi 410 after VDD ramps-up. After power up, node V1 may turn on the second transistor T2 to pull node V0 (which is coupled to the drain of both the third transistor T3 and the fourth transistor T4) to supply voltage (GND) VSS 404. At this point, the tie-hi cell circuitry 400 may enter a zero standby power state (or zero standby current state).

Described herein are various implementations of an integrated circuit. In one implementation, the integrated circuit may include a first stage having a resistor and a capacitor arranged to receive an input voltage signal and provide a triggering signal during ramp of the input voltage signal. The integrated circuit may include a second stage having at least one transistor arranged to receive the triggering signal from the first stage and provide an output voltage signal during ramp of the input voltage signal via gate leakage through the at least one transistor.

Described herein are various implementations of a power-on-reset detector. In one implementation, the power-on-reset detector may include a first circuit configured to receive an input voltage and provide a triggering voltage during ramp of the input voltage. The power-on-reset detector may include a second circuit configured to receive the triggering voltage and provide an output voltage by delaying ramp of the input voltage using gate leakage through at least one transistor.

Described herein are various implementations of a power-on-reset detector circuit. In one implementation, the power-on-reset detector circuit may include a tie-high cell and a capacitor arranged to receive an input signal and provide a triggering signal during ramp of the input signal. The power-on-reset detector circuit may include a first transistor and a second transistor arranged to receive the triggering signal and provide an output signal during ramp of the input signal by delaying ramp of the input signal using gate leakage through the first transistor. The power-on-reset detector circuit may include a Schmitt trigger positioned in a path of the output signal to provide hysteresis and reduce noise associated with the output voltage.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including,"

"comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a first stage having a resistor and a capacitor arranged to receive an input voltage signal and provide a triggering signal during ramp of the input voltage signal; and
   a second stage having at least one transistor arranged to receive the triggering signal from the first stage and provide an output voltage signal during ramp of the input voltage signal via gate leakage through the at least one transistor,
   wherein the at least one transistor is intercoupled to function as a capacitor having high gate input resistance.

2. The integrated circuit of claim 1, wherein the resistor comprises a tie-hi cell having multiple transistors, and wherein the tie-hi cell and the capacitor are arranged to filter the input voltage signal and reduce noise associated with the input voltage signal.

3. The integrated circuit of claim 1, wherein the at least one transistor comprises a metal-oxide-semiconductor field-effect transistor (MOSFET).

4. An integrated circuit, comprising:
   a first stage having a resistor and a capacitor arranged to receive an input voltage signal and provide a triggering signal during ramp of the input voltage signal; and
   a second stage having at least one transistor arranged to receive the triggering signal from the first stage and provide an output voltage signal during ramp of the input voltage signal via gate leakage through the at least one transistor,
   wherein the second stage is configured to provide the output voltage signal by delaying the ramp of the input voltage signal using the gate leakage through the at least one transistor.

5. The integrated circuit of claim 1, wherein the at least one transistor of the second stage comprises multiple transistors having a first transistor and a second transistor arranged to each receive the triggering signal from the first stage and provide the output voltage signal during ramp of the input voltage signal via gate leakage through the first transistor.

6. The integrated circuit of claim 1, wherein the output voltage signal corresponds to a reset timing signal, and wherein the gate leakage through the at least one transistor corresponds to a resistor-capacitor (RC) time constant configured to control the reset timing signal.

7. An integrated circuit, comprising:
   a first stage having a resistor and a capacitor arranged to receive an input voltage signal and provide a triggering signal during ramp of the input voltage signal; and
   a second stage having at least one transistor arranged to receive the triggering signal from the first stage and provide an output voltage signal during ramp of the input voltage signal via gate leakage through the at least one transistor,
   wherein the output voltage signal corresponds to a reset timing signal, and wherein the gate leakage through the at least one transistor corresponds to a temperature independent resistor-capacitor (RC) time constant that uses gate leakage to provide a predetermined time constant to control the reset timing signal.

8. The integrated circuit of claim 1, wherein the output voltage signal corresponds to a reset timing signal, and wherein the first and second stages are arranged to delay the reset timing signal for a period of time after the input voltage signal has reached a full source voltage.

9. The integrated circuit of claim 1, further comprising a third stage having a Schmitt trigger positioned in a path of the output voltage signal to provide hysteresis and reduce noise associated with the output voltage signal.

10. The integrated circuit of claim 1, further comprising a third stage having an inverter positioned in a path of the output voltage signal and a third transistor configured to restrain a rush-through current in the inverter.

11. A power-on-reset detector, comprising:
    a first circuit configured to receive an input voltage and provide a triggering voltage during ramp of the input voltage; and
    a second circuit configured to receive the triggering voltage and provide an output voltage by delaying ramp of the input voltage using gate leakage through at least one transistor.

12. The detector of claim 11, wherein the first circuit comprises resistor-capacitor (RC) circuit having at least one resistor and at least one capacitor arranged to filter the input voltage and reduce noise associated with the input voltage.

13. The detector of claim 12, wherein the at least one resistor comprises a tie-hi cell having multiple transistors arranged to provide the input voltage after ramp of the input voltage.

14. A power-on-reset detector, comprising;
    a first circuit configured to receive an input voltage and provide a triggering voltage during ramp of the input voltage; and
    a second circuit configured to receive the triggering voltage and provide an output voltage by delaying ramp of the input voltage using gate leakage through at least one transistor,
    wherein the at least one transistor comprises a metal-oxide-semiconductor field-effect transistor (MOSFET) intercoupled to function as a capacitor having high gate input resistance, and wherein the MOSFET is positioned to receive the triggering voltage from the first circuit and provide the output voltage during ramp of the input voltage via gate leakage through the at least one transistor.

15. The detector of claim 11, further comprising:
an inverter positioned in a path of the output voltage;
a third transistor positioned to restrain a rush-through current in the inverter; and
a Schmitt trigger positioned in the path of the output voltage after the inverter to provide hysteresis and reduce noise associated with the output voltage.

16. A power-on-reset detector circuit, comprising:
a tie-high cell and a capacitor arranged to receive an input signal and provide a triggering signal during ramp of the input signal;
a first transistor and a second transistor arranged to receive the triggering signal and provide an output signal during ramp of the input signal by delaying ramp of the input signal using gate leakage through the first transistor; and
a Schmitt trigger positioned in a path of the output signal to provide hysteresis and reduce noise associated with the output voltage.

17. A power-on-reset detector circuit, comprising:
a tie-high cell and a capacitor arranged to receive an input signal and provide a triggering signal during ramp of the input signal;
a first transistor and a second transistor arranged to receive the triggering signal and provide an output signal during ramp of the input signal by delaying ramp of the input signal using gate leakage through the first transistor; and
a Schmitt trigger positioned in a path of the output signal to provide hysteresis and reduce noise associated with the output voltage,
wherein the first transistor comprises a p-type metal-oxide-semiconductor (PMOS) transistor intercoupled to function as a capacitor having high gate input resistance, and wherein the second transistor comprises a n-type metal-oxide-semiconductor (NMOS) transistor.

18. The circuit of claim 16, wherein the output voltage corresponds to a reset timing signal, and wherein the gate leakage through the first transistor corresponds to a resistor-capacitor (RC) time constant configured to control the reset timing signal.

19. A power-on-reset detector circuit, comprising:
a tie-high cell and a capacitor arranged to receive an input signal and provide a triggering signal during ramp of the input signal;
a first transistor and a second transistor arranged to receive the triggering signal and provide an output signal during ramp of the input signal by delaying ramp of the input signal using gate leakage through the first transistor; and
a Schmitt trigger positioned in a path of the output signal to provide hysteresis and reduce noise associated with the output voltage,
wherein the output voltage corresponds to a reset timing signal, and wherein the gate leakage through the at least one transistor corresponds to a temperature independent resistor-capacitor (RC) time constant that uses gate leakage to provide a predetermined time constant to control the reset timing signal.

20. The circuit of claim 16, further comprising an inverter positioned in a path of the output voltage before the Schmitt trigger, and a third transistor positioned to restrain a rush-through current in the inverter.

* * * * *